(12) United States Patent
Pace et al.

(10) Patent No.: US 8,269,658 B1
(45) Date of Patent: Sep. 18, 2012

(54) PHOTONIC ANALOG-TO-DIGITAL CONVERSION USING THE ROBUST SYMMETRICAL NUMBER SYSTEM

(75) Inventors: Phillip E. Pace, San Juan Bautista, CA (US); Mylene R. Avizo, Oxnard, CA (US); James Calusdian, Salinas, CA (US); Brian Luke, Chesapeake, VA (US); Kenneth B. Hollinger, Oceanside, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 134 days.

(21) Appl. No.: 13/011,777

(22) Filed: Jan. 21, 2011

Related U.S. Application Data

(60) Provisional application No. 61/297,040, filed on Jan. 21, 2010.

(51) Int. Cl.
    *H03M 1/00* (2006.01)
(52) U.S. Cl. .......... 341/137; 341/155
(58) Field of Classification Search ............ 341/137, 341/155, 159, 122, 118, 139, 158, 120, 156; 375/316, 324, 325
See application file for complete search history.

(56) References Cited

U.S. PATENT DOCUMENTS 6,031,879 A * 2/2000 Pace et al. ............... 375/316

OTHER PUBLICATIONS

Pace, P.E., Styer, D., and Akin, I.A., "A Folding ADC Employing a Robust Symmetrical Number System with Gray-Code Properties," Proceedings of the 1998 IEEE International Symposium on Circuits and Systems, 1998. ISCAS '98., vol. 1, May 31-Jun. 3, 1998, pp. 397-400.

Pace, P.E., Styer, D., and Akin, I.A., "A Folding ADC Preprocessing Architecture Employing a Robust Symmetrical Number System With Gray-Code Properties," IEEE Transactions on Circuits and Systems II: Analog and Digital Signal Processing, vol. 47, No. 5, May 2000, pp. 462-467.

Luke, B.L. and Pace, P.E., "N-Sequence RSNS Ambiguity Analysis," IEEE Transactions on Information Theory, vol. 53, No. 5, May 2007, pp. 1759-1766.

Luke, B.L. and Pace, P.E., "RSNS-to-binary Conversion," IEEE Transactions on Circuits and Systems I: Regular Papers, vol. 54, No. 9, Sep. 2007, pp. 2030-2043.

\* cited by examiner

*Primary Examiner* — Joseph Lauture
(74) *Attorney, Agent, or Firm* — Lisa A. Norris

(57) ABSTRACT

Embodiments in accordance with the invention allow for direct digitization of wideband RF signals without the need for down conversion or the use of mixers. In one embodiment, a preprocessed input analog signal is applied to three wideband Mach-Zehnder interferometers (MZI), e.g., modulators, to amplitude modulate a continuous wave laser signal. A photodetector is used at the output of each interferometer to convert the amplitude modulated optical signal into an electrical signal. This is followed by an amplifier and a low-pass filter (LPF) to increase the signal level and to reduce the noise. A small $m_i$ comparator bank at the output of each LPF is clocked at the sampling frequency and encodes the electrical signal from each detector into a thermometer code that represents an integer value within the modulus. A field programmable gate array (FPGA) then combines the thermometer-code from each comparator bank in order to generate a more convenient 6-bit binary representation, i.e., a digital output.

13 Claims, 15 Drawing Sheets

PHOTONIC ANALOG-TO-DIGITAL CONVERSION USING THE ROBUST SYMMETRICAL NUMBER SYSTEM

CROSS-REFERENCE TO RELATED APPLICATIONS

This application claims the benefit of U.S. Provisional Patent Application No. 61/297,040, filed Jan. 21, 2010, which is hereby incorporated in its entirety by reference.

BACKGROUND OF THE INVENTION

1. Field of the Invention

The present invention relates generally to the conversion of analog signals to digital form.

2. Description of the Related Art

Analog-to-digital conversion (ADC) is an important scheme in military radio frequency (RF) front-end systems. Although electronic ADCs have been existent for decades, research in photonic ADCs has only gained more focus within the last two decades. This can be attributed to several advantages offered by photonic devices such as; ultra-high bandwidth, compactness, immunity to electro-magnetic interference, low-noise in the system and an efficient semiconductor manufacturing technique for integrated electro-optic devices.

With the increasing demands on performance of modern radar, communication and electronic warfare receivers, a prominent trend is to move the digital signal processing closer to the antenna. Digital microwave receivers and radio frequency (RF) memories are expected to digitize the signals directly at the antenna and eliminate the need for down conversion to intermediate frequencies.

Photonic guided-wave technology has played an important role in the development of advanced analog-to-digital converter (ADC) architectures. Prior art advanced ADCs used a laser and a parallel arrangement of electro-optic Mach-Zehnder interferometers (MZIs) to efficiently couple the RF signal into the optical domain. In the MZI, interference was produced between the phase coherent light waves that have traveled over two different path lengths. The light was input to the MZI through a single mode waveguide and a beam splitter divided the light into two equal beams that travelled through the two waveguides. The split beams then recombined in an output waveguide. By applying the RF voltage to a pair of electrodes along each waveguide, the effective path lengths could be varied. As a result, the RF signal could be used to amplitude modulate the output light.

Normally each MZI in the parallel array symmetrically folded the analog signal with the folding period between MZIs being a successive factor of 2. The folded output amplitude from each detector was quantized with a single comparator (differential amplifier and latch). Together the comparator outputs directly encoded the analog signal in a digital Gray code format. These architectures had great promise due to the large bandwidth available for the MZI (B>45 GHz) and the high pulse repetition frequency (tens of GHz) of mode-locked fiber lasers that could be used for sampling.

One of the major limitations associated with that type of approach was the achievable resolution. For the folding periods to be a successive factor of 2, the length of each electrode must also be doubled which adversely affected the device capacitance and ultimately constrained the feasible resolution. For these 1-bit per interferometer approaches, resolution was limited to less than 4 bits.

A prior art modular preprocessing technique based on the optimum symmetrical number system (OSNS) extended the resolution of the photonic MZI approach beyond 1-bit per interferometer. FIG. 1 is a block diagram illustrating one example of an N=3 interferometer ADC 100 using the optimum symmetrical number system (OSNS) in the prior art. OSNS 100 served as a source for resolution enhancement by using several comparators 108 at the output of each detector 106. That is, instead of using one comparator 108 at each detector 106 output, the OSNS technique analyzed the output of each MZI channel i i$\in\{1,2,3\}$ using one of three sets of comparators 108A, 108B, 108C, where each comparator set was comprised of $m_i-1$ comparators in parallel where $m_i$ refers to the OSNS system moduli. FIG. 1 illustrates the prior art implementation for $m_i \in \{3,4,5\}$. When the detector 106 output crossed a comparator's matching threshold value, the comparator output changed from a logic zero to a logic one. The $m_i-1$ comparator thresholds were configured to analyze the dynamic range of the detector's output.

Since the MZI transfer function had a (symmetrical) $\cos^2$ relationship, the comparator thresholds were arranged in a non-linear fashion. For channel i, the total number of comparators with a logic one at any given time is called a symmetrical residue, $x_i$ (or thermometer code); and the combination of all three symmetrical residues from the three sets of comparator systems represents the mapping of the RF antenna voltage into the OSNS domain. A digital representation of the RF signal voltage was then derived within the OSNS-to-binary logic attached at the output of the comparators. By using the OSNS, higher photonic ADC resolutions were feasible using only N=3 MZIs over the 1-bit-per-interferometer architectures described earlier. Unfortunately, using this prior art method, the comparators within each MZI channel must switch states at exactly the same time otherwise an encoding error resulted in the symmetrical residues, which in turn, translated into an error at the output of the OSNS-to-binary logical network.

SUMMARY OF THE INVENTION

Embodiments in accordance with the invention provide a photonic preprocessing method based on the robust symmetrical number system (RSNS). Embodiments in accordance with the invention include an added property that reduces the possibility of error during the digitization process. This property, referred to as the integer Gray code property, allows only one symmetrical residue to change state at any one time thus reducing the possibility of large encoding errors while maintaining the improvement in the resolution to greater than 1-bit per interferometer.

In one embodiment, a method for photonic analog-to-digital conversion using the RSNS includes: receiving an analog signal; inputting the received analog signal into a parallel array of optical folding circuits that symmetrically fold the analog signal in accordance with one of N coprime moduli, where there are $2Nm_i$ least significant bits within a folding period; generating a folded representation of the analog signal; amplitude analyzing each folded representation with m comparator thresholds to encode the analog signal into a sequence of symmetrical residues, wherein the symmetrical residues are the sum of the number of thresholds crossed for each of the N folded waveforms and make up one of the N sequences of integers within the RSNS; and combining the RSNS integers into a digital output.

Embodiments in accordance with the invention are best understood by reference to the following detailed description when read in conjunction with the accompanying drawings.

DETAILED DESCRIPTION OF THE INVENTION

Figure 1:
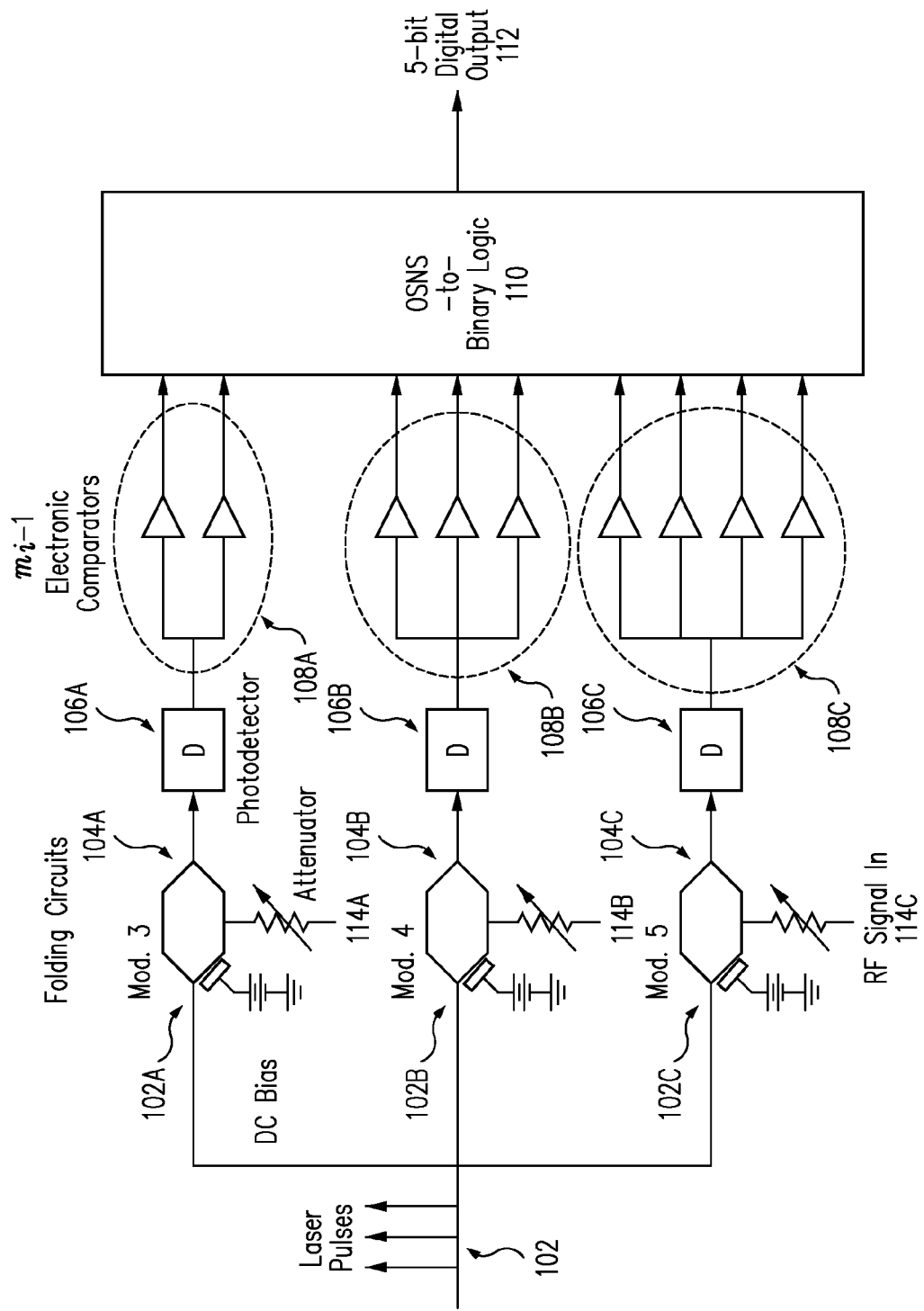
FIG. 1 is a block diagram illustrating one example of an N=3 interferometer ADC 100 using the optimum symmetrical number system (OSNS) in the prior art.
Figure 2:
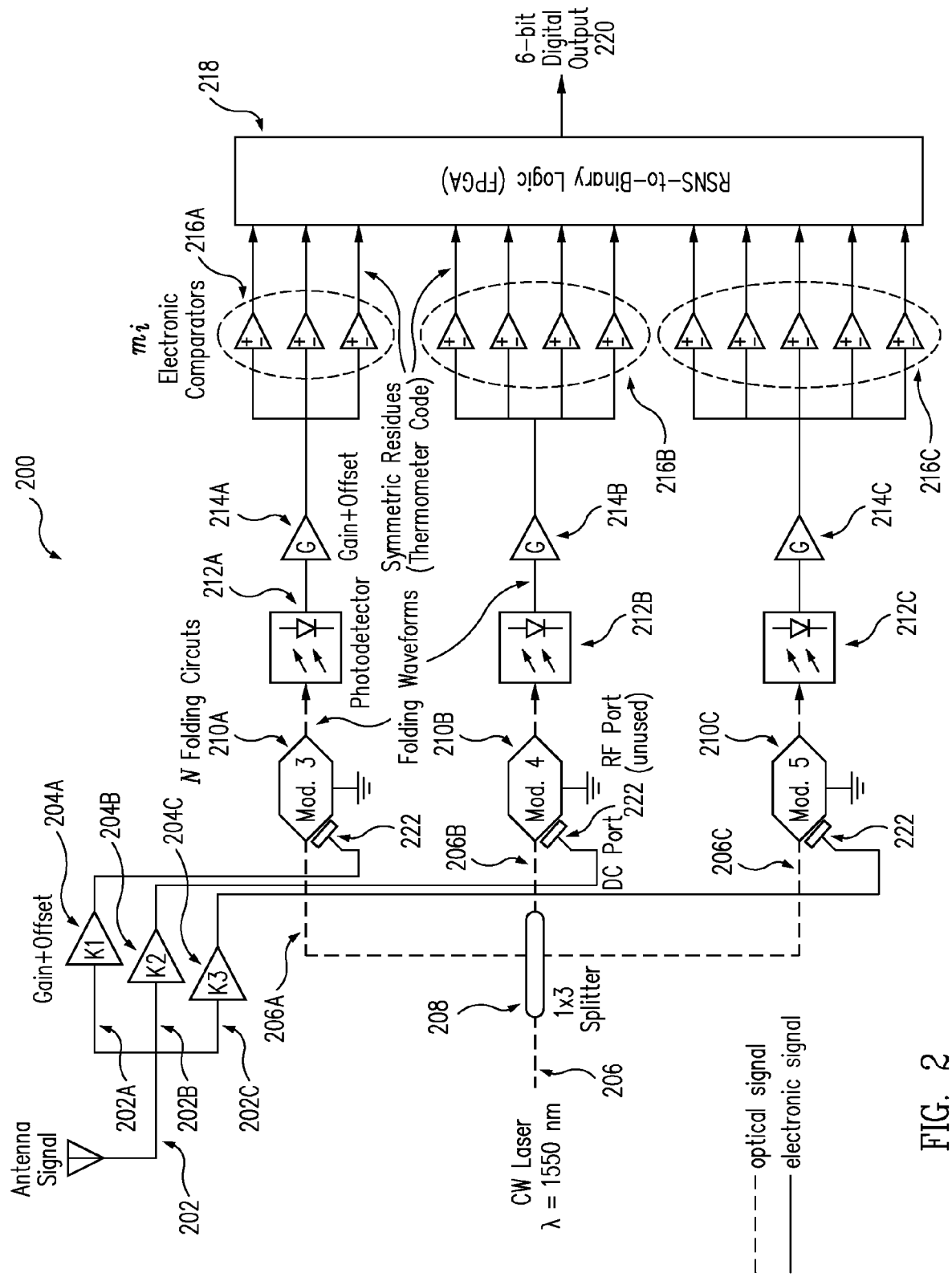
FIG. 2 is a block diagram of a RSNS based photonic analog-to-digital converter (ADC) in accordance with one embodiment.

Referring generally to FIG. 2, embodiments in accordance with the invention, utilize a 3-modulus scheme to preprocess an input analog signal, such as an antenna RF signal. In one embodiment, the preprocessed input analog signal is applied to three wideband Mach-Zehnder interferometers (MZI), e.g., modulators, to amplitude modulate a continuous wave laser signal. A photodetector is used at the output of each interferometer to convert the amplitude modulated optical signal into an electrical signal. This is followed by an amplifier and a low-pass filter (LPF) to increase the signal level and to reduce the noise. A small $m_i$ comparator bank at the output of each LPF is clocked at the sampling frequency and encodes the electrical signal from each detector into a thermometer code that represents an integer value within the modulus. A field programmable gate array (FPGA) then combines the thermometer-code from each $m_i$ comparator bank in order to generate a more convenient 6-bit binary representation, i.e., a digital output. Embodiments in accordance with the invention allow for direct digitization of wideband RF signals without the need for down conversion or the use of mixers.

Figure 3A:
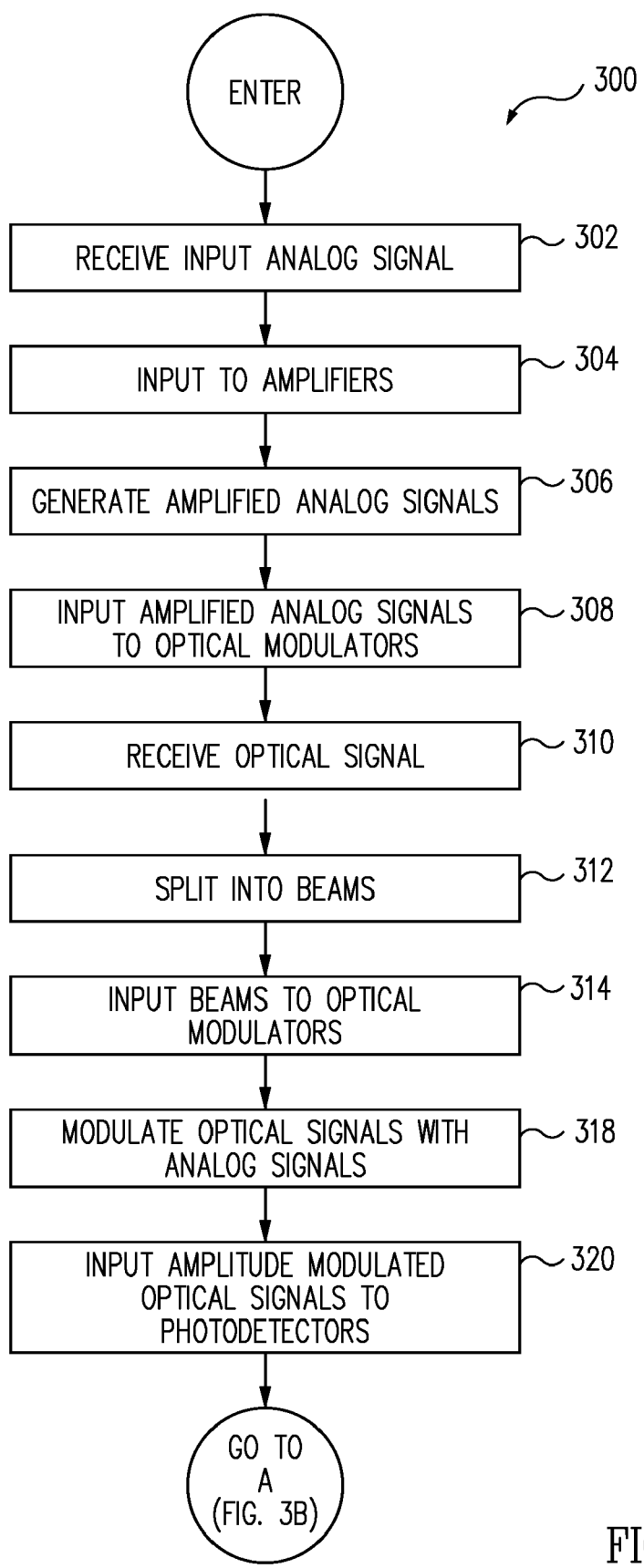
FIG. 3 is a process flow diagram of an RSNS based photonic analog to digital conversion in accordance with one embodiment.
Figure 3B:
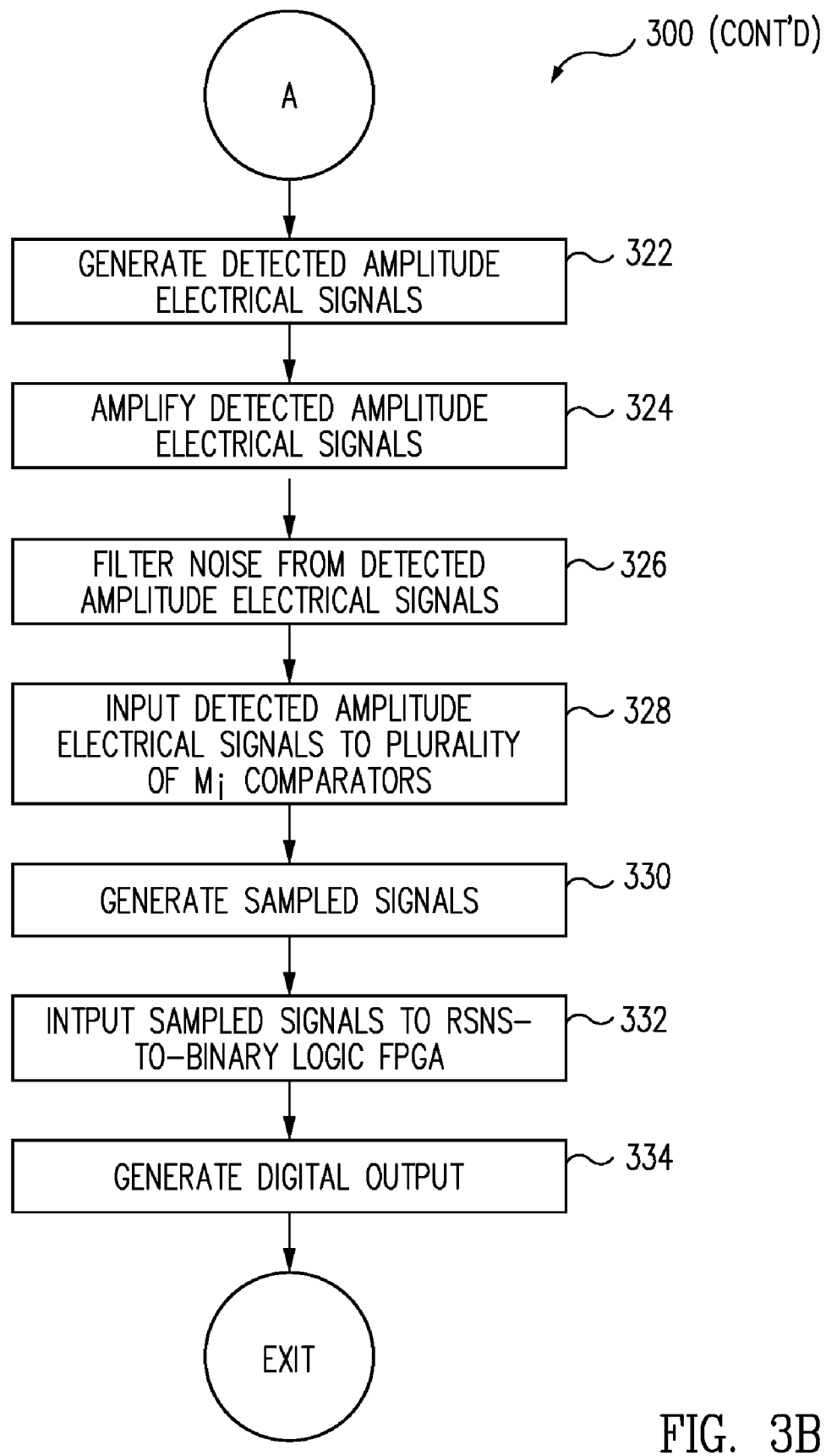

FIG. 2 is a block diagram of a RSNS based photonic analog-to-digital converter (ADC) 200 in accordance with one embodiment. More particularly, in one embodiment, FIG. 2 illustrates an N=3 interferometer ADC 200 using the robust symmetrical number system (RSNS) in accordance with one embodiment. FIG. 3 is a process flow diagram of an RSNS based photonic analog-to-digital conversion (ADC) method 300 in accordance with one embodiment. Referring now to FIGS. 2 and 3 together, in one embodiment, an analog signal 202, such as RF signal received by an antenna, is received (operation 302). Analog signal 202 is input to three variable-gain amplifiers 204 (operation 304) and amplified using variable-gain amplifiers 204 to produce three amplified RF signals (operation 306). For example, a first analog signal 202A is input to a first amplifier 204A to produce a first amplified analog signal; a second analog signal 202B is input to a second amplifier 204B to produce a second amplified analog signal; and a third analog signal 202C is input to a third amplifier 204C to produce a third amplified analog signal.

Each amplified analog signal output from each amplifier 204 is input to a corresponding modulator 210 at a modulator DC port 222 (operation 308). A DC voltage bias is also applied on the port 222 of each modulator 210 to obtain the necessary phase shift in the transmissivity for alignment of the RSNS channels. For example, the amplified analog signal output from amplifier 204A is input to modulator 210A; the amplified analog signal output from amplifier 204B is input to modulator 210B; and the amplified analog signal output from amplifier 204C is input to modulator 210C.

In one embodiment, a 1.55-μm continuous wave optical signal 206 (operation 310), such as from a continuous wave (CW) distributed feedback (DFB) laser, is input through a 1×3 splitter 208 (operation 312). Splitter 208 divides laser signal 206 into three beams, i.e., a first beam 206A, a second beam 206B, and a third beam 206C, providing a signal for input to separate Mach-Zehnder modulators 210 (operation 314). Thus, for example, first beam 206A is input to modulator 210A, a first modulator; second beam 206B is input to modulator 210B, a second modulator; and third beam 206C is input to modulator 210C, a third modulator. Herein a modulator 210 is also referred to as an MZI.

As each amplified analog signal enters a corresponding modulator port 222, electro-optic modulation occurs to produce amplitude modulated optical signals (operation 318). In one embodiment, modulators 210 function as optical folding circuits that symmetrically fold the amplified analog signal in accordance with one of N coprime moduli, where there are $2Nm$ least significant bits within a folding period and generate a folded representation of the analog signal as further detailed herein.

After electro-optic modulation, each amplitude modulated optical signal is input to a photodetector 212 (operation 320). For example, the amplitude modulated optical signal output from modulator 210A is input to photodetector 212A; the amplitude modulated optical signal output from modulator 210B is input to photodetector 212B; and the amplitude modulated optical signal output from modulator 210C is input to photodetector 212C. Each photodetector 212 converts the amplitude modulated optical signal into a detected amplitude electrical signal (operation 322). For example, photodetector 212A generates a first detected amplitude electrical signal; photodetector 212B generates a second detected amplitude electrical signal; and photodetector 212C generates a third detected amplitude electrical signal.

In one embodiment, the detected amplitude electrical signals output from each of photodetectors 212 are input to summing amplifiers 214 (operation 324). In one embodiment, summing amplifiers 214 are used to increase the voltage range of the signals to 1.25 $V_{pp}$ with an offset of 0.625 VDC. Thus, for example, the first detected amplitude electrical signal from photodetector 212A is input to summing amplifier 214A to generate a first amplified detected amplitude electrical signal; the second detected amplitude electrical signal from photodetector 212B is input to summing amplifier 214B to generate a second amplified detected amplitude electrical signal; and the third detected amplitude electrical signal output from photodetector 212C is input to summing amplifier 214C to generate a third amplified detected amplitude electrical signal. In one embodiment, each amplifier 214 includes or is followed by a filter (not shown) to reduce the noise prior to sampling by $m_i$ comparators 216 (operation 326).

After noise reduction, the amplified detected amplitude electrical signals are input to (operation 328) and sampled using a bank of $m_i$ comparators 216, one set of $m_i$ comparators 216 for each modulator 210, to generate sampled signals (operation 330). For example, in one embodiment, the first detected amplitude electrical signal associated with modulator 210A is input to $m_i$ comparator bank 216A to generate a first set of sampled signals; the second detected amplitude electrical signal associated with modulator 210B is input to $m_i$ comparator bank 216B to generate a second set of sampled signals; and the third detected amplitude electrical signal associated with modulator 210C is input to $m_i$ comparator bank 216C to generate a third set of sampled signals.

The sampled signals from $m_i$ comparators 216 are then input to RSNS-to-binary logic FPGA 218 (operation 332) and processed using an RSNS-to-binary encoding scheme. The RSNS-to-binary encoding scheme converts the three-modulus RSNS signals to a unipolar 6-bit binary code output 220, i.e., a digital output (operation 334). In one embodiment, each code within the 6-bit binary representation corresponds to a quantized value (dynamic range $\hat{M}=43$).

Robust Symmetrical Number System (RSNS)

Symmetrical number systems are derived from modular sequences, that is, the values in the sequences are repeated. These number systems consist of $N \geq 2$ integer sequences, where each sequence is associated with one of the coprime moduli $m_i$ for that system. Each member sequence for a symmetrical number system has a unique integer arrangement and a folding period (i.e. largest sequence of digits in a sub-sequence before it is repeated again in the larger sequence). In the robust symmetrical number system (RSNS), each of the N member sequences is made up of integers derived from the corresponding moduli, $m_i$, for that particular member sequence. The RSNS is based on the following sequence $$\{x'\} = [0,1,2,\ldots,m-1,m,m-1,\ldots,2,1]  \quad (1)$$

To form the N-sequence RSNS, each term in (1) is repeated N times in succession. The integers within one folding period of a member sequence are then $$\{x_h\} = [0,0\ldots,0,1,1,\ldots,1,\ldots,m-1,\ldots,m-1,\\ m,m,\ldots,m,m-1,\ldots,m-1,\ldots,1,\ldots 1] \quad (2)$$

This results in a sequence with a period of $$P_{m_i} = 2Nm_i \quad (3)$$

with $i \in \{1, 2, 3\}$ for this particular embodiment. Each member sequence within the system is shifted to the right or left $h_i = i-1$ places. Further, if each member sequence with period $P_{m_i}$ is extended, then the system of N member sequences considered collectively forms the RSNS. At each location (or index) h within the system, we consider the corresponding value for each member sequence and identify the symmetrical residue (or thermometer code) $x_h$, such that $X_{h+nP_{m_i}} = X_h$ where $n \in \{0,\pm1,\pm2,\ldots\}$ and $h \in I^+$, where $I^+$ is the set of all non-negative integers. $x_h$ is called a symmetrical residue of $h+n2mN$ modulo $2mN$.

Let $X_h$ be the three-element vector of symmetrical residues at a given location h within the RSNS. Table 1 shows $X_h$ (read vertically in the figure) at each location h for an N=3 RSNS system with $m_i=[3\ 4\ 5]$ and $s_i=[0,1,2]$. As an example, for h=7, the vector of symmetrical residues is $X_7=[2,2,1]$. For the RSNS provided here, the dynamic range is $\hat{M}=43$. It is the largest range of unambiguous $X_h$ within this particular implementation of the RSNS. That is, within the span $\hat{M}$, each vector of symmetric residues (or thermometer codes) $X_h$ is unique. The location within the RSNS at which this point begins is at h=61 (not shown in Table 1).

The fundamental period $P_f$ for an N-sequence RSNS is the total length of each member sequence after it has been extended to a point where all member sequences are constructed of only complete sub-sequences. That is, for the example shown in Table 1, each member sequence is extended to h=359 to construct the complete RSNS system.

TABLE 1

Three-sequence RSNS (partial) structure using a right shift.

| $X_h$ | ($m_1$ = 3) | 0 | 0 | 0 | 1 | 1 | 1 | 2 | 2 | 2 | 3 | 3 | 3 | 2 | 2 | 2 | 1 | 1 | 1 | 0 | 0 | 0 | 1 | 1 | 1 | ... |
|---|---|---|---|---|---|---|---|---|---|---|---|---|---|---|---|---|---|---|---|---|---|---|---|---|---|---|
| | ($m_2$ = 4) | 1 | 0 | 0 | 0 | 1 | 1 | 1 | 2 | 2 | 2 | 3 | 3 | 3 | 4 | 4 | 4 | 3 | 3 | 3 | 2 | 2 | 2 | 1 | 1 | ... |
| | ($m_3$ = 5) | 1 | 1 | 0 | 0 | 0 | 1 | 1 | 1 | 2 | 2 | 2 | 3 | 3 | 3 | 4 | 4 | 4 | 5 | 5 | 5 | 4 | 4 | 4 | 3 | ... |
| | h | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | ... |

Alternatively, the fundamental period $P_f$ is the least common multiple of the set of coprime moduli $[2Nm_1, 2Nm_2, \ldots, 2Nm_N]$ or more concisely given by $$P_f = 2Nm\Pi m_i \quad (5)$$

Figure 4:
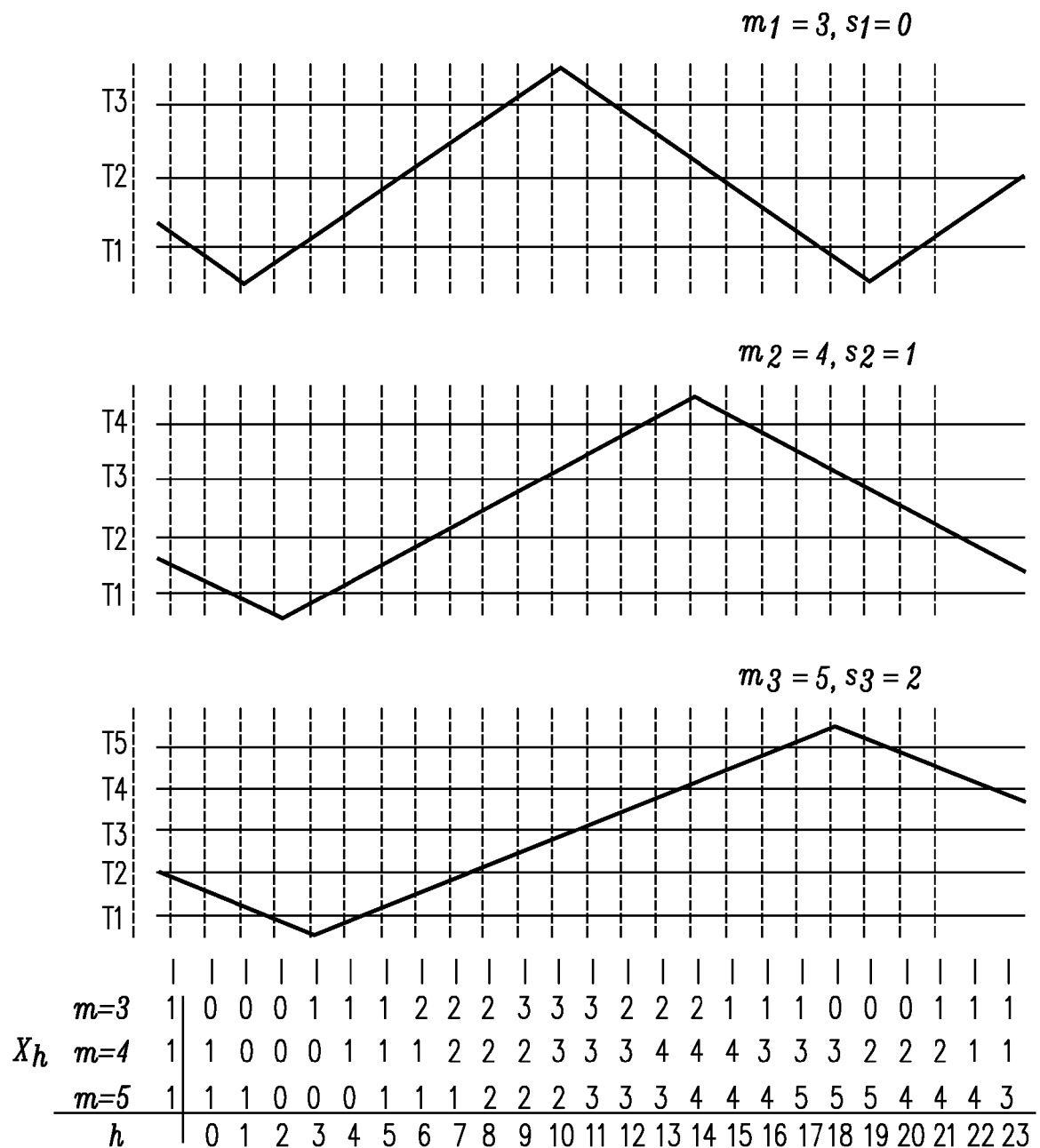
FIG. 4 illustrates folding waveforms for RSNS moduli $m_i$=[3,4,5] and $s_i$=[1,2,3] in accordance with one embodiment.

FIG. 4 illustrates folding waveforms for RSNS moduli $m_i=[3,4,5]$ and $s_i=[1,2,3]$ in accordance with one embodiment. More particularly, FIG. 4 shows how a RSNS may be implemented using three triangular symmetrical folding waveforms, each one associated with a particular modulus and right shifted according to $s_i=[0,1,2]$. Only a portion of the RSNS sequence structure is shown here. On the left margin of the figure are example threshold values for each of the $m_i$ comparators analyzing each folding waveform. At the bottom of the figure, the symmetrical residues are shown, which corresponds to the number of comparators in the ON state at any one time. Each of the integers within the sequence shown on the bottom of the figure represents the number of thresholds crossed. That is, the integer value in each sequence is generated by comparing the amplitude of the folding waveform to the thresholds in the $m$ comparators within each modulus (or channel). FIG. 4 also shows the ambiguity in thermometer codes occurring between the first and seventh column of symmetric residues for this particular example. Lastly, FIG. 4 also highlights the integer Gray code property, which can be seen when $X_h$ is compared to its immediate h+1 or h−1 neighbor. The integer Gray code transition results in just one integer in $X_h$ changing value by ±1.

An important consideration for any RSNS application is the calculation of the dynamic range $\hat{M}$. For example, to use the RSNS to design a 10-bit ADC, it must be determined which combination of moduli form the best RSNS with $\hat{M} \geq 2^{10}$. The calculation of the RSNS $\hat{M}$ and the starting position h are a function of N and the choices for $m_i$. For all but a select few RSNS systems there is no closed-form solution for $\hat{M}$ and h. A closed-form solution for N=3 moduli of the form $2^r-1, 2^r, 2^r+1$ is $$\hat{M} \frac{3}{2} m_1^2 + \frac{15}{2} m_1 + 7 \quad (6)$$

where r is any integer and $m_1 \geq 3$.

The shift values $s_i$ for each sequence do not affect the RSNS dynamic range but do make a difference in the location of the beginning position h of the dynamic range and the ending position $h+\hat{M}-1$ as shown in Table 2.

TABLE 2

Dynamic range $\hat{M}$, beginning position (h) and ending position $h + \hat{M} - 1$ for $m_1 = 3, m_2 = 4, m_3 = 5$ using a right shift.

| Moduli $m_i$ | Shift $s_i$ | System Dynamic Range $\hat{M}$ | Fundamental Period $P_f$ | Beginning-Ending of System Dynamic Range |
|---|---|---|---|---|
| 3 | 0 | | | |
| 4 | 1 | 43 | 360 | 61-103 |
| 5 | 2 | | | 241-283 |
| 3 | 1 | | | |
| 4 | 0 | 43 | 360 | 8-50 |
| 5 | 2 | | | |
| 3 | 2 | | | |
| 4 | 1 | 43 | 360 | 81-123 |
| 5 | 0 | | | |

From Table 2, the beginning code position can be either h=61 or h=241 with each sequence employing a right shift of $s_i$=[0,1,2] LSBs. After the beginning code is chosen, the symmetrical residues at this point are determined by first subtracting off the integer number of LSBs within a fold as $$n_i = h - \left\lfloor \frac{h}{2Nm_i} \right\rfloor 2Nm_i \quad (7)$$

This value is then used to find the symmetrical residue $x_h$ as $$x_h = \begin{cases} \left\lfloor \frac{n_i - s_i}{N} \right\rfloor & s_i \leq n_i \leq Nm_i + s_i + 1 \\ \left\lfloor \frac{2Nm_i + N - n_i + s_i - 1}{N} \right\rfloor & Nm_i + s_i + 2 \leq n_i \leq 2Nm_i + s_i - 1 \end{cases} \quad (8)$$

For example, the vector of symmetrical residues at h=241 are $X_h$=[2 2 3]$^T$.

The structure of each of the N sequences ensures that two successive RSNS n-tuples (combined terms from all N sequences) when considered together, differ by only one integer resulting in an integer Gray code property.

Photonic RSNS ADC Architecture

In one embodiment, commercially-available photonic and electronic components were integrated in a configuration as shown in FIG. 2 using N=3 moduli ($m_1$=3, $m_2$=4, $m_3$=5). Different from the OSNS prior art technique, however, there are $m_i$ comparators in each MZI channel of the RSNS implementation. In one embodiment, this system achieved a dynamic range $\hat{M}$=43 (or n=5.43 bits) with a least significant bit LSB=195 mV. It can be understood by those of skill in the art that an MZI channel or channel refers to the circuitry or operations on signals corresponded with each modulator 210 as distinct from the other modulators 210.

Low frequency (<20 kHz) testing of the device resulted in an effective number of bits ENOB=4.6 bits, a signal-to-noise plus distortion SINAD=29.5 dB, and a total harmonic distortion THD=−31.2 dB. Measurement of the noise floor for two input frequencies (10 kHz and 20 kHz) was used to quantify the jitter power $\sigma^2$=0.14 as a percentage of the sampling frequency. This value includes the sample time uncertainty of the clock, as well as, the instability of the MZI transmittance, which is the dominant source of jitter.

More particularly referring to FIG. 2, in one embodiment, RF signal 202 is amplified using three operational amplifier circuits 204. These are designed to drive the electronic port 222 of each MZI modulator 210 so that the desired modular folding waveforms are obtained at the corresponding output of each photodetector 212. Within each amplifier circuit 204, a DC bias component is also incorporated to adjust the operating point of the corresponding MZI modulator 210 to achieve the necessary alignment between channels. In one embodiment, a 1550 nm distributed feedback (DFB) laser is used and a 1×3 polarization-maintaining optical splitter 208 provides a source of constant intensity light 206A, 206B, 206C, to each MZI modulator 210.

In one embodiment, at the output of each MZI modulator 210, an InGaAs photodetector 212 followed by a summing amplifier 214 is used. Summing amplifier 214 amplifies the low-voltage detector output signal from each photodetector 212 and adds a DC voltage to shift the detector output above 0V and move the signal within the input voltage range of comparators 216. In one embodiment, a low pass filter (not shown) is added after each summing amplifier 214 to reduce the noise prior to sampling by $m_i$ comparators 216. In one embodiment, the comparator sampling rate and matching threshold voltages are set using a XILINX Field Programmable Gate Array (FPGA) 218 module. To convert the sampled symmetrical residues into a more convenient 6-bit binary code 220, an RSNS-to-binary conversion algorithm is embedded into the FPGA using a combination of logic circuits.

Figure 7:
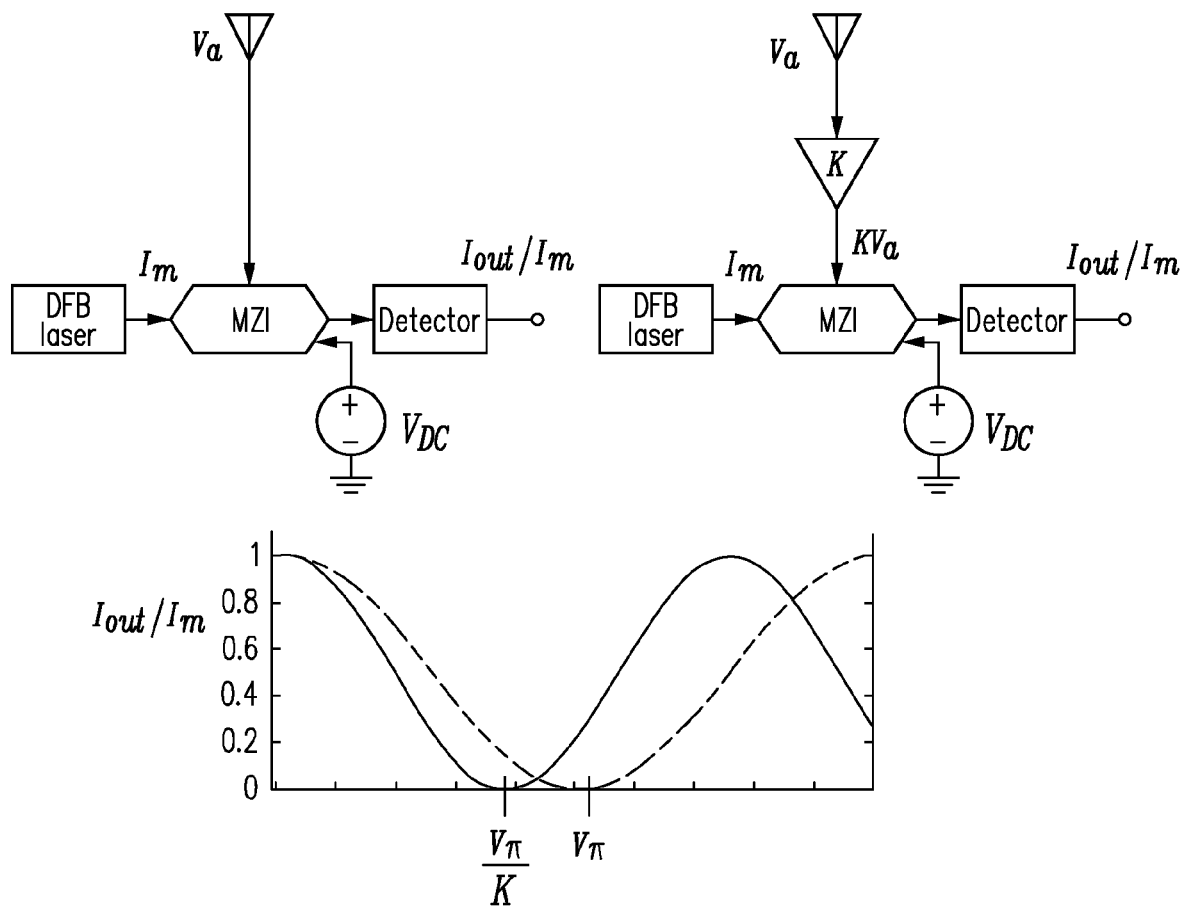
FIG. 7 illustrates an amplifier created effective half-wave voltage $V\pi_i/K_i$.
Figure 8:
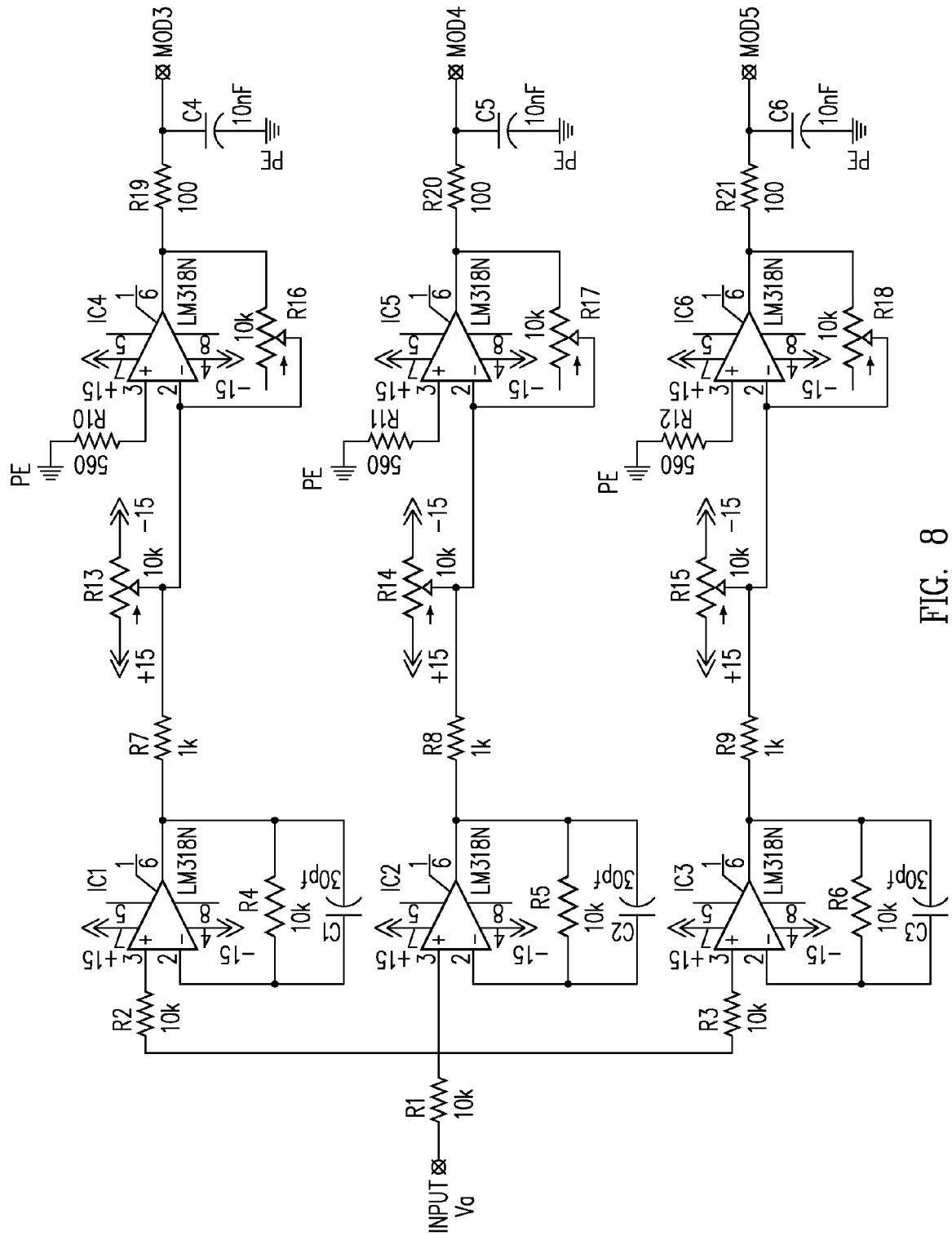
FIG. 8 illustrates amplifier preprocessing stages with gain $K_1$=2.917, $K_2$=2.222 and $K_3$=1.750.
Figure 9A:
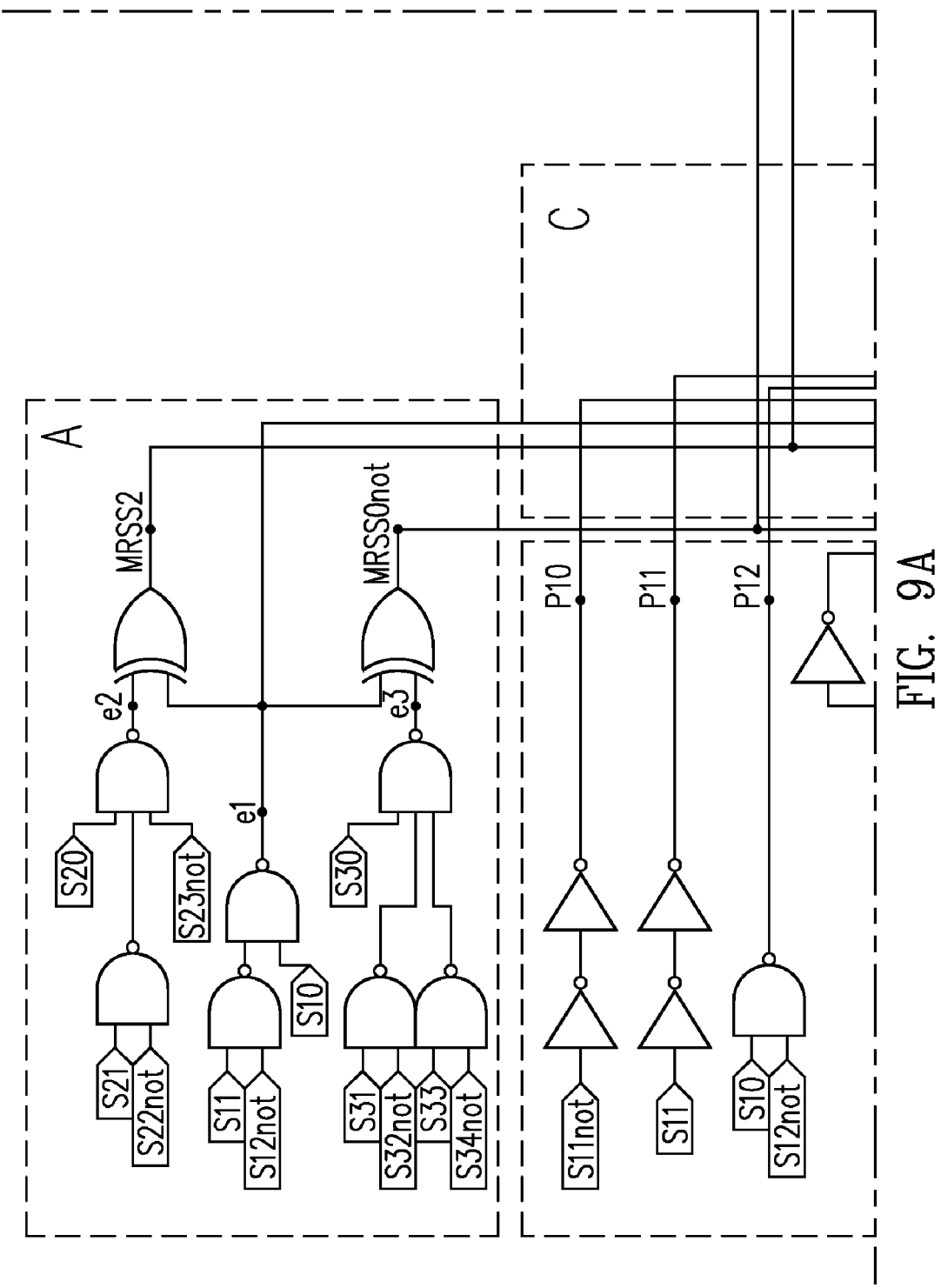
FIG. 9 illustrates an RSNS-to-binary conversion logic circuit.
Figure 9B:
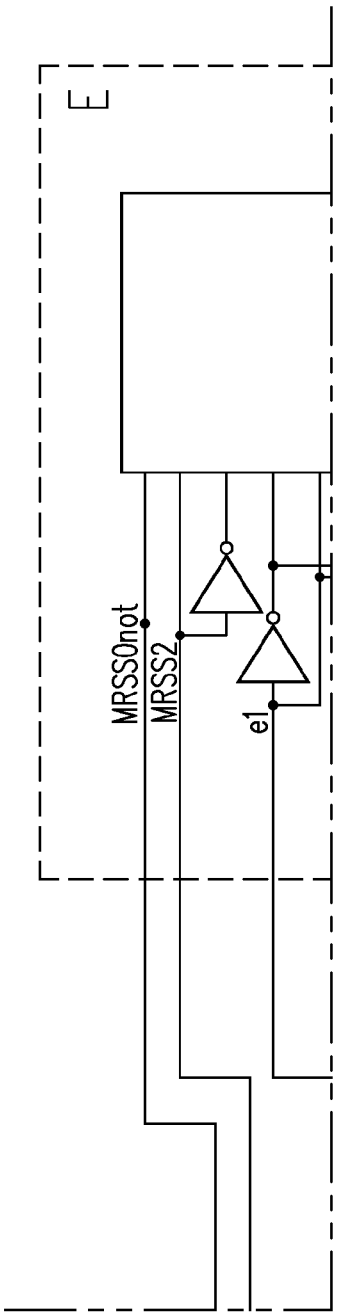
Figure 9C:
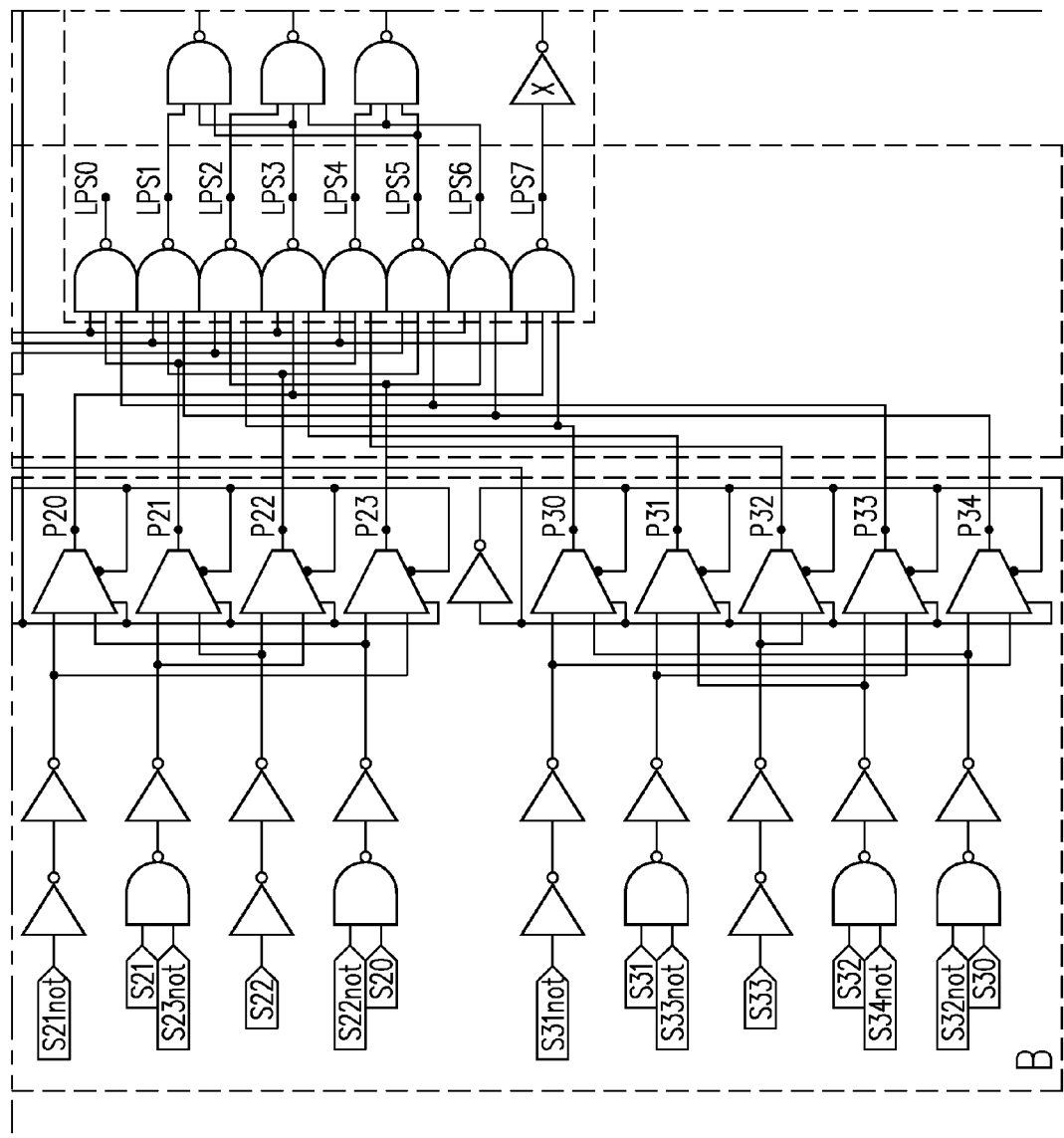
Figure 9D:
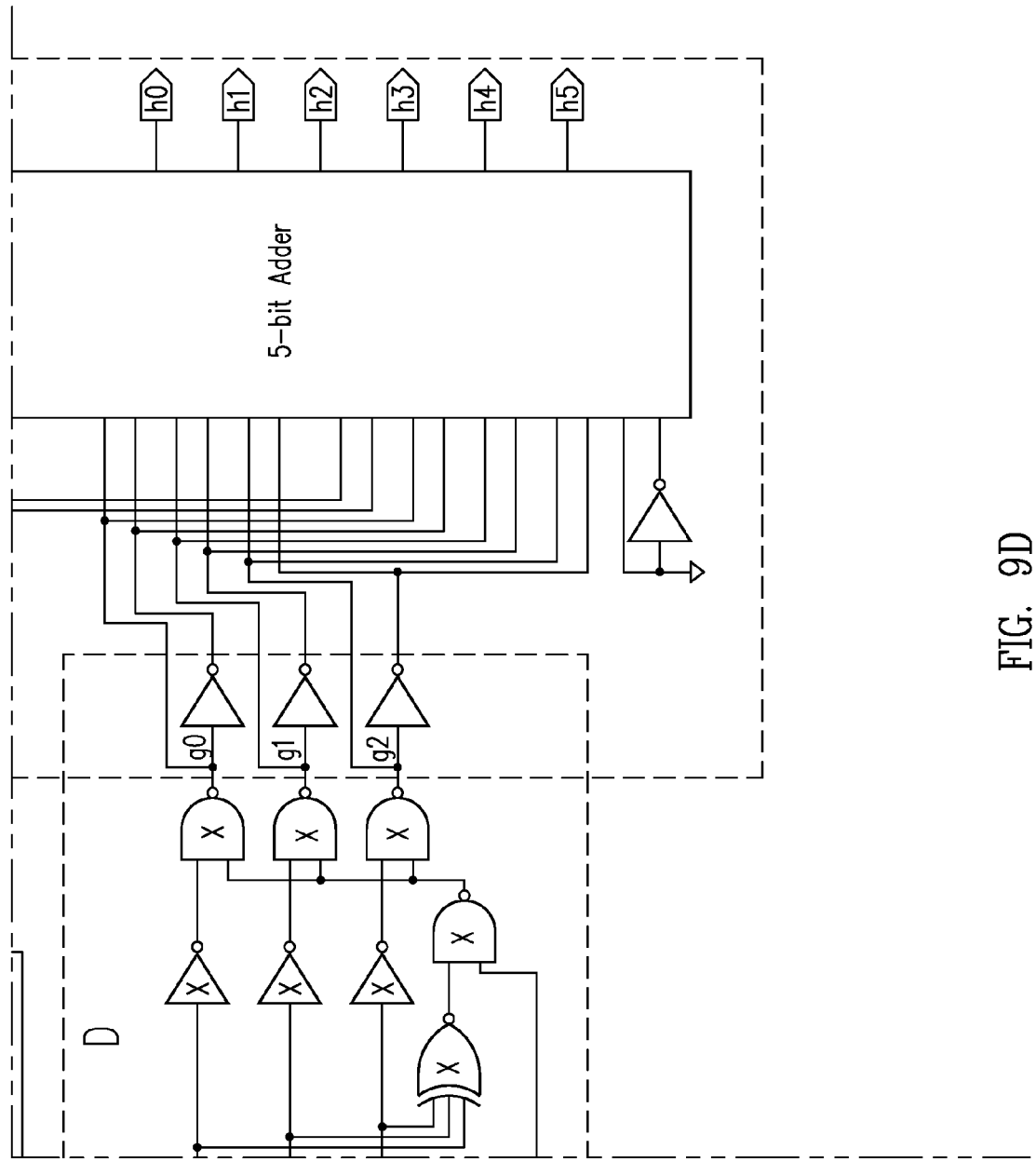

In one embodiment, each MZI modulator 210 folds the antenna voltage in accordance with the channel modulus $m_i$ by using an amplifier. With the amplifier gain $K_i$ the effective half-wave voltage is $V_{\pi i}/K_i$ as shown in FIG. 8 where $V_{\pi i}$ is the modulator's half-wave voltage (out of the box). The amplifier gain is adjusted to give $2Nm_i$ LSBs within a complete fold $2V_{\pi i}/K_i$. Although the same MZI part numbers can be used for each channel, they will often differ in the measured half-wave voltages on both the DC port, and RF port. Since these values are also a function of the input signal frequency, the bandwidth being digitized is selected where the half-wave voltages do not change. FIG. 7 illustrates an amplifier created effective half-wave voltage $V_{\pi i}/K_i$.

With a full-scale voltage $V_{FS}$=8.35 V, the size of the LSB is $$LSB = \frac{V_{FS}}{\log_2(\hat{M})} = \frac{V_{\pi i}}{K_i Nm_i} = 195 \text{ mV} \quad (9)$$

The folding waveforms at the output of each MZI modulator 210 are aligned by applying a DC bias $V_{DCi}$ to shift (left or right) the phase of each MZI output. Table 3 shows the MZI half-wave voltages, the effective half-wave voltages, and the DC bias applied for the bipolar design being reported. In one embodiment, each MZI modulator 210 must provide enough folds in the output to cover the RSNS dynamic range $\hat{M}$. The maximum voltage that is applied to each channel is $\pm V_{FS}/2 = \hat{M} V_{\pi i}/2NK_i m_i$=4.193 V.

TABLE 3

MZI half-wave voltages, effective half-wave
voltages and DC bias values used (LSB = 0.195 V).

| i | $V_{\pi i}$ (V) | $V_{\pi i}/K_i$ (V) | $V_{DC}/K_i$ (V) |
|---|---|---|---|
| 1 | 5.12 | 1.755 | −1.131 |
| 2 | 5.20 | 2.340 | 1.395 |
| 3 | 5.12 | 2.925 | 1.314 |

With $K_1$ chosen, the gain of the other N−1 MZI amplifier gains are adjusted to fold the antenna signal in accordance with $m_i$ as $$K_2 = \frac{V_{\pi 2}}{V_{\pi 1}}\left(\frac{m_1}{m_2}\right) K_1 \qquad (10)$$

$$\vdots$$

$$K_N = \frac{V_{\pi N}}{V_{\pi N-1}}\left(\frac{m_{N-1}}{m_n}\right) K_{N-1}$$

The resulting gain values are $K_1=2.917$, $K_2=2.222$ and $K_3=1.750$. FIG. 8 illustrates amplifier preprocessing stages with gain $K_1=2.917$, $K_2=2.222$ and $K_3=1.750$. In one embodiment, the DC port 222 is used for both the RF and DC voltages due to its 1 MΩ internal impedance and its ability to handle the voltage through the entire dynamic range. For each modulus, the gain of the first stage is 1, and the gain of the second stage is $K_i$. The center potentiometer is for the DC bias that is required. In the present example, the operating bandwidth of the preprocessor stage is on the order of a few tens of kilohertz due in large part by the requirement to drive the MZI port 222 with voltages that are in excess of $\hat{M}$ (LSB) volts. For the $m_3$ channel, this is on the order of 24 volts peak-to-peak.

DC Bias and Comparator Thresholds

Figure 5:
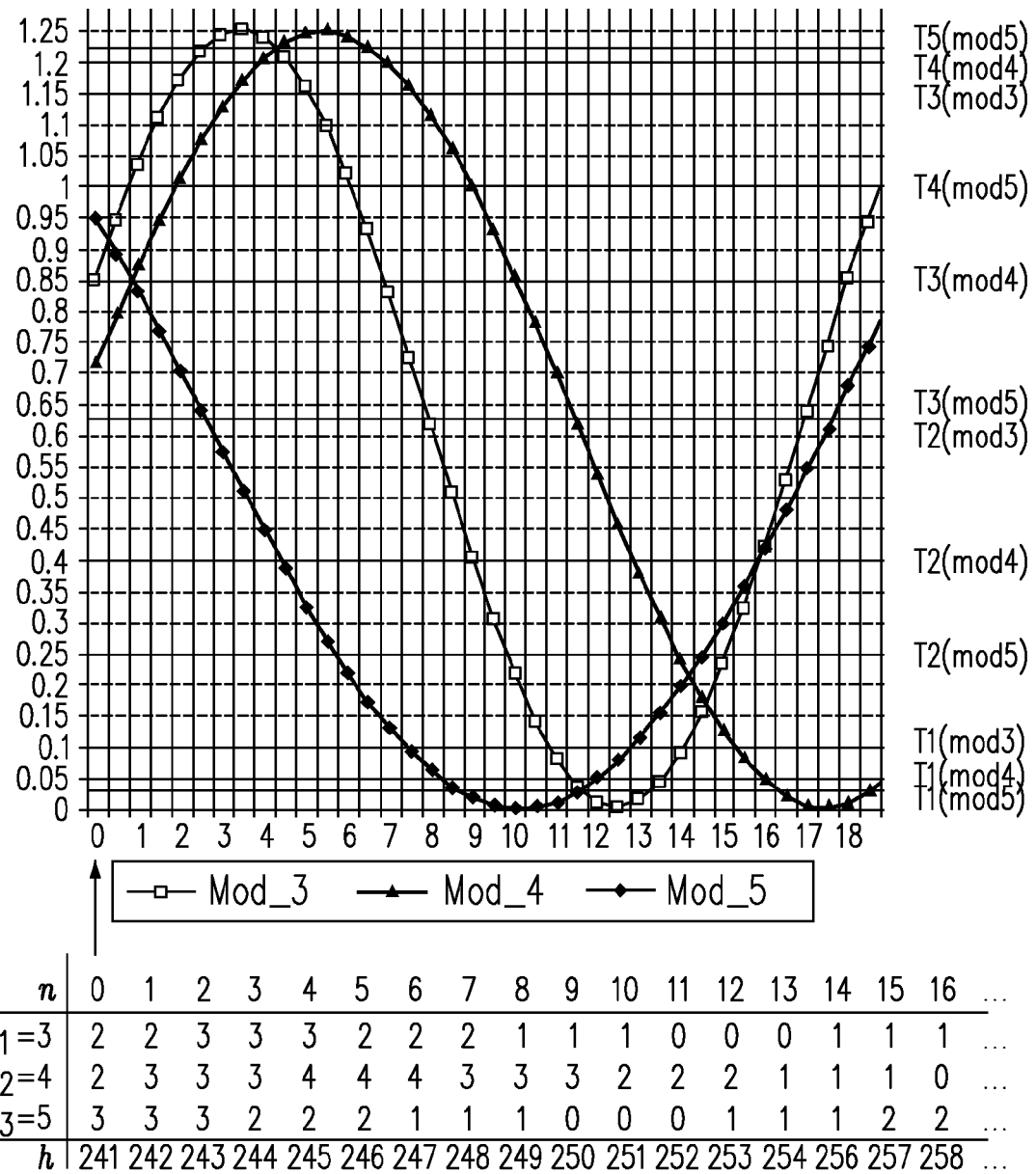
FIG. 5 illustrates RSNS N=3 MZI channel output waveforms and symmetrical residues together with the comparator matching threshold levels in accordance with one embodiment.

FIG. 5 illustrates RSNS N=3 MZI channel output waveforms and symmetrical residues together with the comparator matching threshold levels in accordance with one embodiment. In FIG. 5, the N=3 MZI output waveforms are at the beginning of the dynamic range, and at the bottom are the symmetrical residues $x_i$ within each channel. In one embodiment, FIG. 5 is used to align the MZI waveforms at the beginning of the code in order to ensure the thresholds are crossed correctly.

The comparator matching threshold levels are $$T(k, m_i) = V_D * \cos^2\left[\frac{\pi}{2} - \left(\frac{\pi(kN+1)}{P_{m_i}} + \frac{\pi}{2P_{m_i}}\right)\right] \qquad (11)$$

where $k=0, 1 \ldots m_i-1$, $V_D$ is the maximum voltage at the detector/amplifier output (input voltage to the comparators). Using (11) with $V_D=1.25$ V, the matching threshold values for each comparator are $$T(k,m_1)=[0.1,0.625,1.15]$$

$$T(k,m_2)=[0.05,0.4,0.85,1.2]$$

$$T(k,m_3)=[0.03,0.25,0.625,1.0,1.22] \qquad (12)$$

Figure 6:
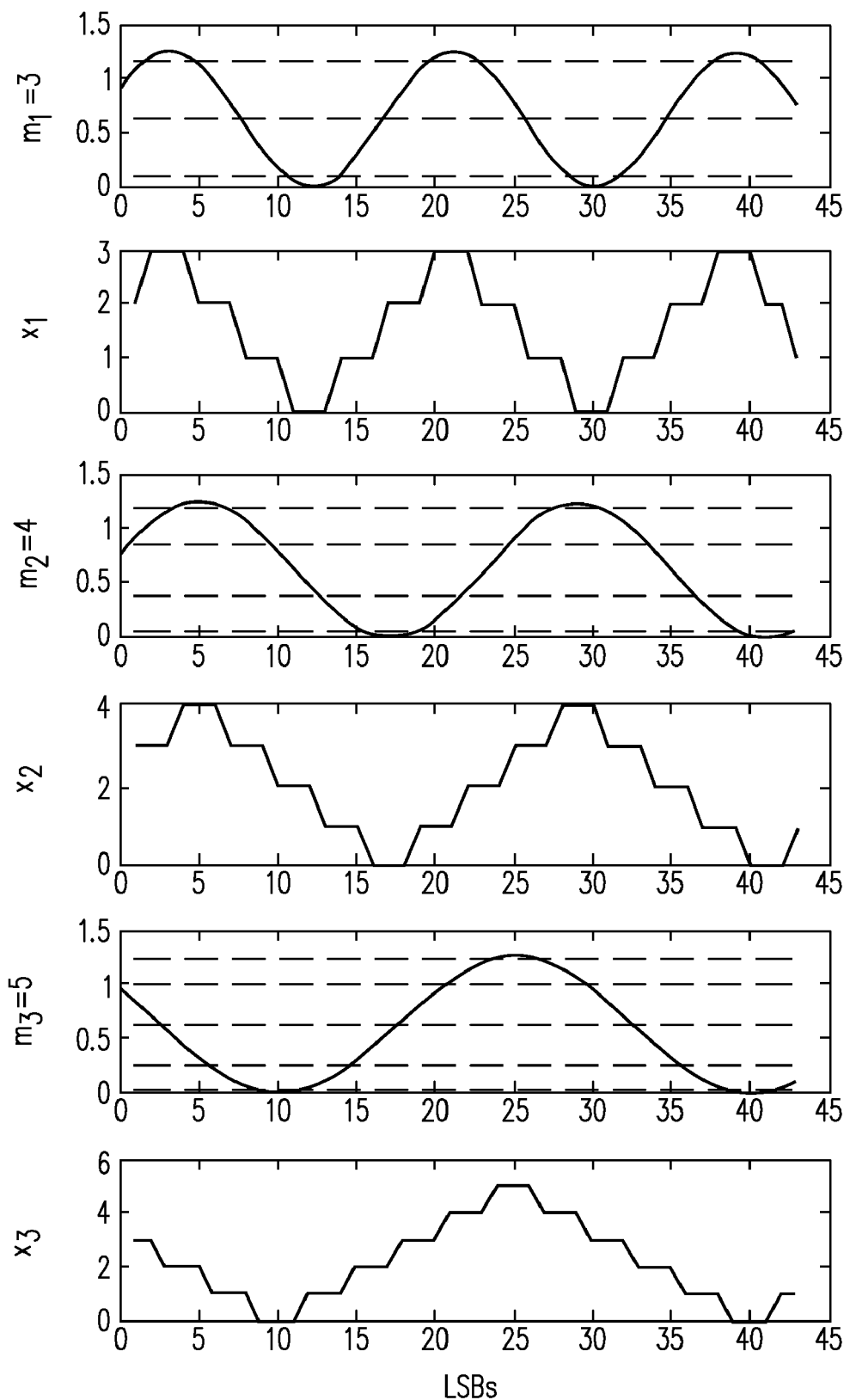
FIG. 6 shows a simulation of the complete folding waveforms, threshold levels and the 43 code values in accordance with one embodiment.

As illustrated in FIG. 5, only one comparator matching threshold value is crossed at any one time (Gray code), cycling through the N channels. The thermometer code for each set of comparators is $x_i=[0, \ldots m_i]$ and depends on the number of thresholds crossed within each channel. FIG. 6 shows a simulation of the complete folding waveforms, threshold levels and the 43 code values in accordance with one embodiment.

RSNS-to-Binary Encoding Using FPGA

In one example, three MAXIM 516A quad comparator chips are used, i.e., comparators 216A, 216B, and 216C, each with a programmable matching threshold value. The thresholds are set using FPGA 218, which is also used to compute the symmetrical residue-to-binary conversion. In one embodiment, comparators 216 and FPGA 218 use the same clock signal to ensure synchronous timing and sampling between the two devices. In one embodiment, to convert the symmetrical residues from each channel into a more convenient 6-bit binary code RSNS-to-binary conversion logic is used.

Figure 10A:
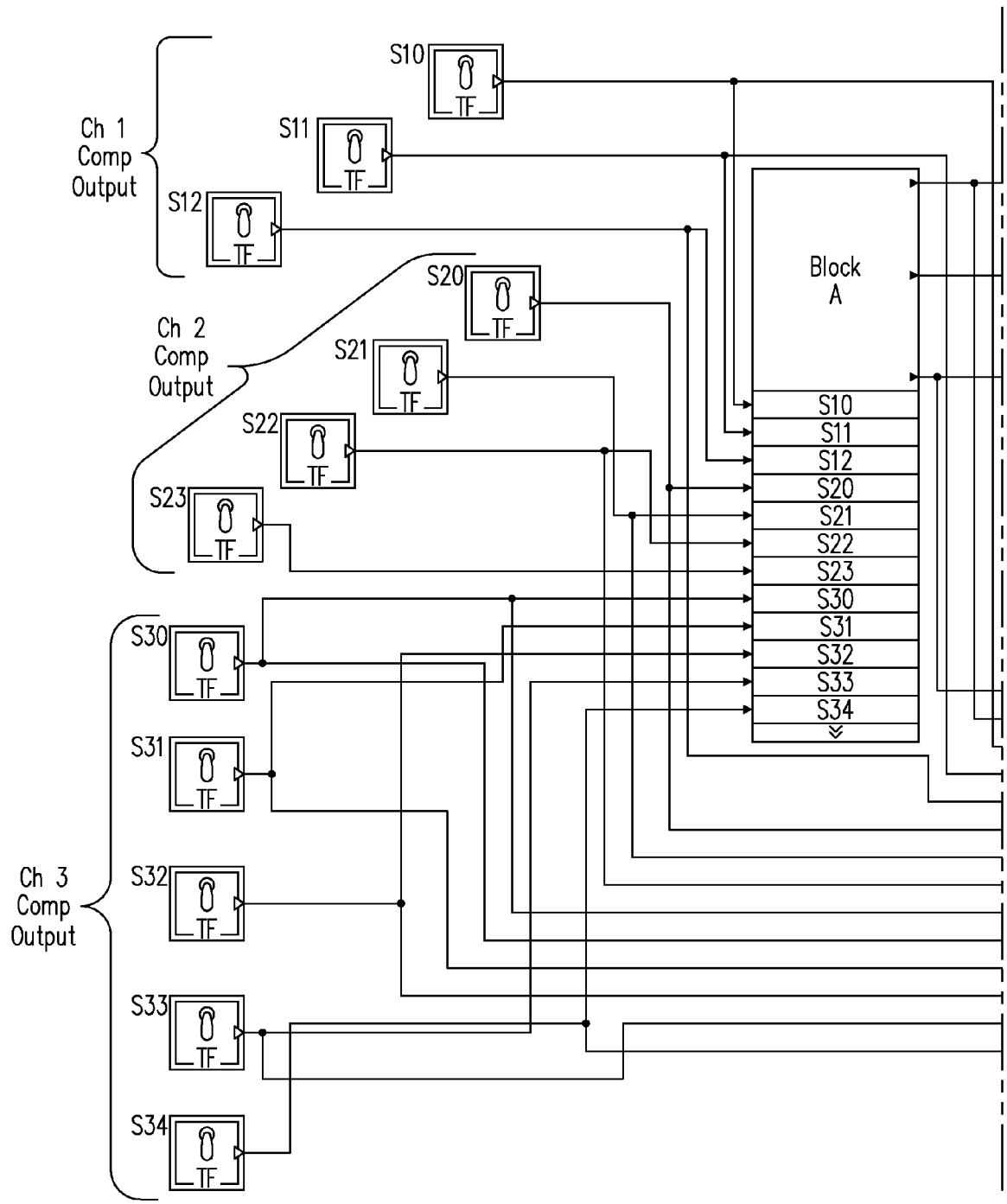
FIG. 10 illustrates an RSNS-to-binary NI LabView sub-VI graphical program and shows the LabView environment including the RSNS-to-binary logic block.
Figure 10B:
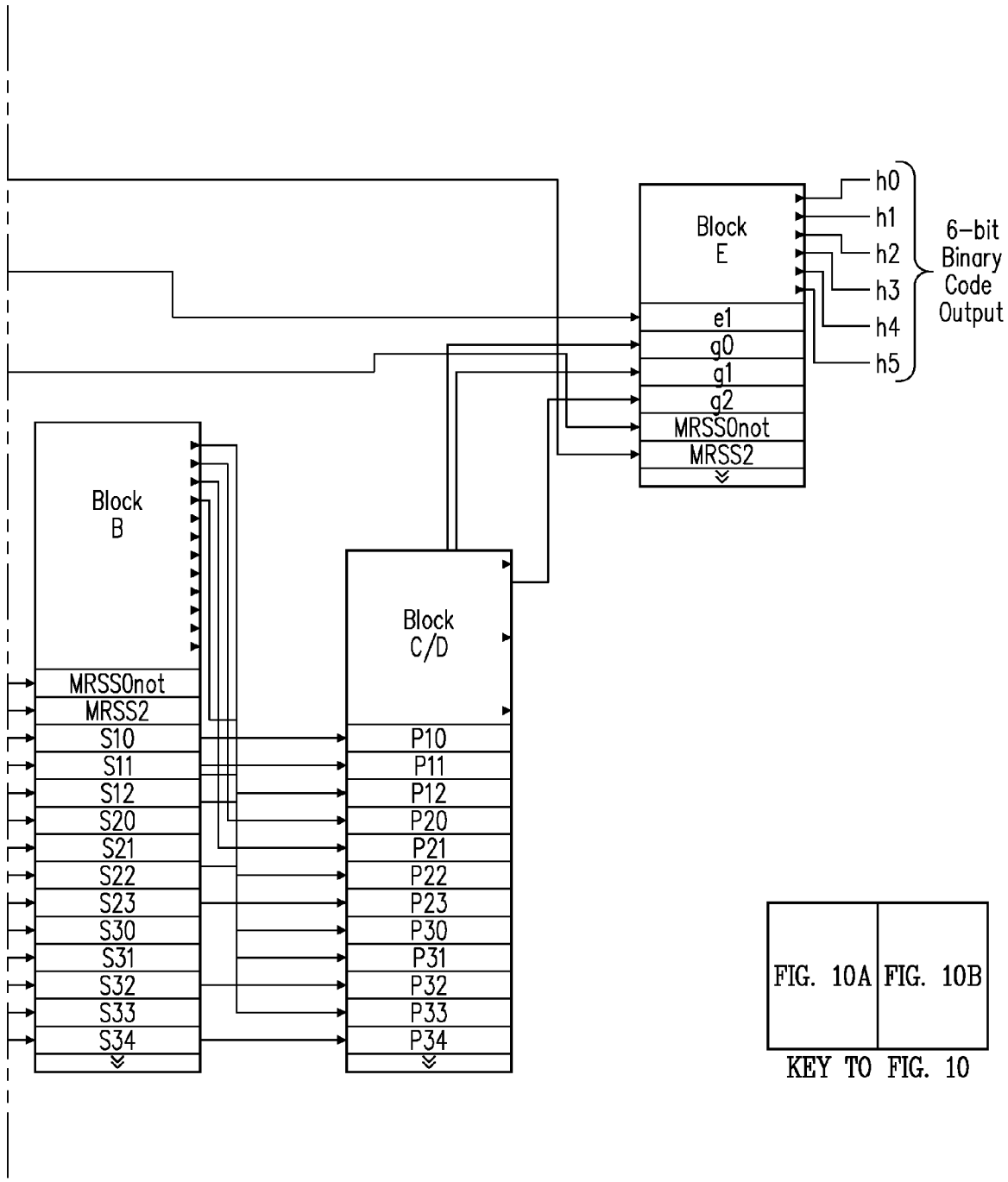

FIG. 9 illustrates an RSNS-to-binary conversion logic circuit. In one example, the logic block shown in FIG. 9 is programmed into a Xilinx FPGA, e.g., FPGA 218, using the National Instruments LabView environment on a PC. It consists of sections A-E and contains an additional capability to log the output data into a text file for the data analysis. FIG. 10 illustrates an RSNS-to-binary NI LabView sub-VI graphical program and shows the LabView environment including the RSNS-to-binary logic block. In this example, the sampling rate of FPGA 218 is $f_s$=283 kS/s.

Inside the RSNS-to-binary LabView code are sub-VI's, which are structures that represent each block of logic shown in FIG. 9. The FPGA operation begins when the main VI is executed. To collect the values of the binary code bits, a host-VI is created. This VI functions as an interface between a host computer and the FPGA target or device. By using the first-in first-out (FIFO) function, a direct memory access (DMA) engine is employed to transfer data between the FPGA device and the host computer.

In view of this disclosure, those of skill in the art can implement various embodiments of the present invention in a wide variety of configurations including a variety of physical hardware configurations using an operating system and computer programming language of interest to the user. This disclosure provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure.

We claim:

1. A method for photonic analog-to-digital conversion using the Robust Symmetrical Number System (RSNS) comprising:
   receiving an analog signal;
   inputting said analog signal into a parallel array of optical folding circuits that symmetrically fold said analog signal in accordance with one of N coprime moduli $m_i$, where there are $2Nm_i$ least significant bits within a folding period;
   generating a folded representation of said analog signal;
   amplitude analyzing each said folded representation with $m_i$ comparator thresholds to encode the input signal into a sequence of symmetrical residues,
   wherein said symmetrical residues are the sum of the number of thresholds crossed for each of said N folded waveforms and make up one of the N sequences of integers within the RSNS; and
   combining the RSNS integers from each modulator channel into a digital output.

2. A method for digitizing an analog signal comprising:
   receiving an analog signal;

mapping said analog signal into an RSNS domain, wherein said RSNS domain is a representation of said analog signal in the form of the symmetric residues provided at the output of one or more sets of $m_i$ comparators.

3. The method of claim 2 wherein the representation of said analog signal is in the form of thermometer code provided at the output of one or more sets of $m_i$ comparators.

4. A method for photonic analog-to-digital conversion of an RF signal using the Robust Symmetrical Number System (RSNS) comprising:
receiving an analog signal;
inputting said analog signal into a first, second, and third amplifier;
amplifying each of said analog signals to produce a first, second, and third amplified analog signal;
inputting each of said first, second, and third amplified analog signal into a corresponding first, second, and third modulator at a DC biased port;
receiving an optical signal from a laser;
inputting said optical signal into a splitter;
splitting said optical signal into a first, second, and third beam;
inputting each of said first, second, and third beam into a corresponding said first, second and third modulator;
modulating each of said first, second, and third amplified analog signal with an associated said first, second, and third beam to generate a first, second, and third amplitude modulated optical signal;
inputting each of said first, second, and third amplitude modulated optical signal into an associated first, second, and third photodetector to generate an output first, second, and third electronic signal;
inputting each of said first, second, and third electronic signal into an associated first, second, and third amplifier to generate a first, second, and third amplified electronic signal;
inputting each said first, second, and third amplified electronic signal to an associated first, second, and third bank of comparators to generate a plurality of sampled signals; and
inputting each said plurality of sampled signals into an RSNS-to-binary field programmable gate array (FPGA) to generate a digital output.

5. The method of claim 4 wherein said optical signal is a continuous wave optical signal.

6. The method of claim 4 wherein the optical signal is a pulsed optical signal.

7. The method of claim 4 further comprising:
filtering noise from each said first, second, and third amplified electronic signals prior to inputting each said first, second, and third amplified electronic signals to said associated first, second, and third bank of comparators.

8. The method of claim 4 wherein in there are $m_i$ comparators in each bank of comparators.

9. The method of claim 4 wherein said modulators function as optical folding circuits that symmetrically fold each associated first, second, and third analog signal in accordance with one of N coprime moduli $m_i$, where there are $2Nm_i$ least significant bits within a folding period, and generate a folded representation of the analog signal.

10. The method of claim 9, wherein each of said first, second, and third amplitude modulated optical signal is a folded representation of said associated first, second, and third analog signal.

11. The method of claim 9 wherein each modulator folding period $2V_\pi$ is related to a modulus $m_i$.

12. A method for photonic analog-to-digital conversion of an analog signal using the Robust Symmetrical Number System (RSNS) comprising:
receiving an input analog signal;
symmetrically folding said input analog signal with an input optical beam using a parallel array of a plurality of photonic modulators to generate an output of a plurality of optically modulated signals;
detecting output amplitudes of said plurality of optically modulated signals;
analyzing said detected output amplitudes using a plurality of comparators;
adjusting comparator matching thresholds for each detected output amplitudes to encode each detected output amplitude into an RSNS sequence integer which is the sum of the comparator thresholds crossed; and
combining the RSNS integers from each modulator channel into a digital output.

13. The method of claim 12 wherein only one comparator sum changes state from one code to the next code.

* * * * *